US006656666B2

(12) United States Patent
Simons et al.

(10) Patent No.: US 6,656,666 B2
(45) Date of Patent: Dec. 2, 2003

(54) TOPCOAT PROCESS TO PREVENT IMAGE COLLAPSE

(75) Inventors: John P. Simons, Wappingers Falls, NY (US); Kenneth J. McCullough, Fishkill, NY (US); Wayne M. Moreau, Wappingers Falls, NY (US); Charles J. Taft, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 11 days.

(21) Appl. No.: 09/742,401

(22) Filed: Dec. 22, 2000

(65) Prior Publication Data

US 2002/0081533 A1 Jun. 27, 2002

(51) Int. Cl.$^7$ ................................................. G03F 7/00
(52) U.S. Cl. ..................... 430/322; 430/311; 430/315; 430/329; 430/330; 430/331
(58) Field of Search ................................ 430/311, 315, 430/322, 325, 329, 330, 331

(56) References Cited

U.S. PATENT DOCUMENTS

| 5,326,672 A | * | 7/1994 | Tanaka et al. ............... 430/156 |
| 5,374,503 A | * | 12/1994 | Sachdev et al. ............ 430/312 |
| 5,474,877 A | | 12/1995 | Suzuki ....................... 430/325 |
| 5,665,527 A | | 9/1997 | Allen et al. ................. 430/325 |
| 5,977,041 A | * | 11/1999 | Honda ........................ 510/175 |
| 6,067,728 A | * | 5/2000 | Farmer et al. ................ 34/470 |
| 6,240,936 B1 | * | 6/2001 | DeSimone et al. ........... 134/18 |
| 6,319,853 B1 | * | 11/2001 | Ishibashi et al. ............ 430/312 |
| 6,334,266 B1 | * | 1/2002 | Moritz et al. ................. 34/337 |
| 6,358,673 B1 | * | 3/2002 | Namatsu ..................... 430/311 |
| 6,398,875 B1 | * | 6/2002 | Cotte et al. ................... 134/10 |

FOREIGN PATENT DOCUMENTS

| JP | 07-020637 | * | 1/1995 | ................. 430/322 |
| JP | 09-034116 | * | 2/1997 | ................. 430/325 |

OTHER PUBLICATIONS

Ober, C.K., et al., "Imaging Polymers with Supercritical Carbon Dioxide," *Advanced Materials*, vol. 9, No. 13, 1997, pp. 1039–1043.

Mori, S., et al., "Pattern Collapse in the Top Surface Imaging Process after Dry Development," *J. Vac. Sci. Technol. B*, vol. 16, No. 6, Nov./Dec. 1998, pp. 3744–3747.

Tanaka, T., et al., "Mechanism of Resist Pattern Collapse During Development Process," *Jpn. J. Appl. Phys.*, vol. 32, Pt. 1, No. 12B, 1993, pp. 6059–6064.

John A. Hyatt, "Liquid and Supercritical Carbon Dioxide as Organic Solvents," *J. Org. Chem.*, Vo. 49, 1984, pp. 5097–5101.

Lopes, J.A., et al., "On the Effect of Polymer Fractionation on Phase Equilibrium in $CO_2$+poly(ethylene glycol)s Systems," *The Journal of Supercritical Fluids*, vol. 16, 2000, pp. 261–267.

Jackson, K., et al., "Water Solubility Measurements in Supercritical Fluids and High–Pressure Liquids Using Near–Infrared Spectroscopy," *Analytical Chemistry*, vol. 67, No. 14, Jul. 15, 1995, pp. 2368–2372.

O'Neill, M. L., et al., "Solubility of Homopolymers and Copolymers in Carbon Dioxide," *Ind. Eng. Chem. Res.*, No. 37, 1998, pp. 3067–3079.

* cited by examiner

Primary Examiner—Mark F. Huff
Assistant Examiner—K Sagar
(74) Attorney, Agent, or Firm—Connolly Bove Lodge & Hutz LLP

(57) ABSTRACT

The invention relates generally to photolithographic techniques, and particularly, but not by way of limitation, to a method for preventing the collapse of the image pattern during the stage of drying the image. The invention also relates to structures fabricated using the inventive method.

16 Claims, 1 Drawing Sheet

SUPERCRITICAL $CO_2$ DRYING TO PREVENT IMAGE COLLAPSE

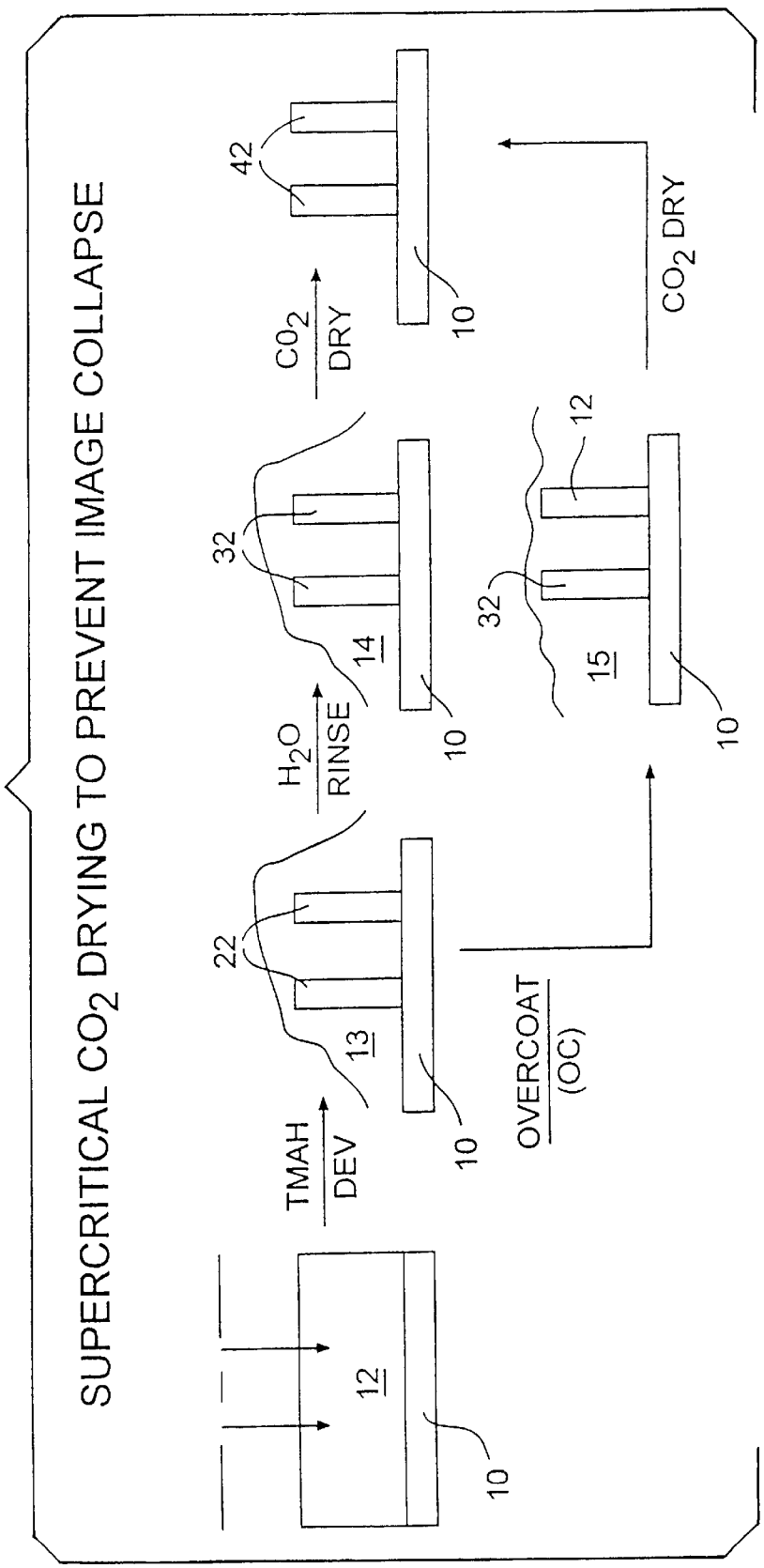

TOPCOAT PROCESS TO PREVENT IMAGE COLLAPSE

FIELD OF THE INVENTION

The invention relates generally to photolithographic techniques, and particularly, but not by way of limitation, to a method for preventing the collapse of the image pattern during the stage of drying the image.

BACKGROUND

Photolithographic processes are well-known in the art for use in the manufacture of semiconductor devices. Lithography generally involves transferring a desired pattern, such as a circuit pattern, through a resist layer onto an underlying silicon substrate. The first step of the process generally involves forming a resist layer on the substrate layer. The resist layer is then exposed to patterned radiation to cause dissolution differentiation in the resist layer. The resist layer is then developed generally with liquid developer. The pattern is then transferred to the underlying silicon substrate with transfer techniques such as etching or ion implantation.

There is an increasing desire in the industry for higher circuit density in microelectronic devices which are made using lithographic techniques. One method of increasing the number of components per chip is to decrease the minimum feature size of the chip, which requires higher lithographic resolution. There is a goal in the industry to reduce the feature size below 0.20 microns.

Following exposure to light (or electrons) the resist is developed typically using a wet chemical process. The developing chemicals and selective portions of the resist are rinsed away and the resist is dried. A problem arises in that the resist pattern may tend to collapse under the surface tension forces of the rinsing liquid especially as the liquid is withdrawn during the drying process. This tendency to collapse is exacerbated by high aspect ratio resist patterns required as the minimum feature size of the chip devises decreases.

Chemically amplified resists are based on an aqueous solution of tetraethyl ammonium hydroxide with a water based rinse, as shown in, for example, U.S. Pat. No. 5,580,694 to Allen and Semiconductor Lithography, chapters 2 and 10, by W. Moreau, Plenum Press, 1987.

"Mechanism of Resist Pattern Collapse During Development Process", A. Tanaka et al.,*J. Appl. Physics*, Vol. 32, pp. 6059–6064, 1993, and "Pattern Collapse in the Top Surface Imaging Process after Dry Development," M. Mori et al.,*J. Vac. Sic. and Tech.*, Vol. B16, pp. 3477–47, 1999, describe the image collapse of resist images with aspect ratio (thickness to line width) caused by the high surface tension of water (80 dynes/cm$^2$) rinse drying step exerting a physical force on the walls of the resist image.

A method of developing a resist using hot water to reduce the surface tension of water is shown in U.S. Pat. No. 5,474,877 to Suzuki, but, according to Tanaka, an order of magnitude in surface tension for the rinse/dry step is needed to address submicron image collapse. Supercritical fluids such as carbon dioxide have very low surface tension (<1), as shown in U.S. Pat. No. 5,665,527 to Allen and "Imaging Polymers with Supercritical Carbon Dioxide," C. Ober et al., *Advance Materials*, Vol. 9, pp. 1039–1043, 1997, and have been used to develop fluoropolymers as negative images. Water-based conventional chemically amplified resists remain the workhorse formulations for 248 nm, 193 nm and 157 nm generations. Water itself is sparingly soluble in supercritical $CO_2$, as shown in J. Hyatt's "Liquid and Supercritical Carbon Dioxide as Organic Solvents," *J. Org. Chem.*, Vol. 49, pp. 5097–5101, 1984. To remove water, an alcohol rinse has been suggested in Tanaka, but most of the amplified resist are susceptible to attack or dissolution in polar solvents. If a water rinse is used in a manufacturing line, the subsequent transport of the "wet resist" without drying to the next process station is necessary to prevent image collapse. Some polymers such as polyethers, e.g., polyethylene and polypropylene glycol, as shown in "Solubility of Homopolymers and Copolymers in Carbon Dioxide," M. O'Neill et al., *Ind. Eng. Chem. Res.*, Vol. 37, pp. 3067–3079, 1998 and "On the Effect of Polymer Fractionation on the Phase Equilibrium in $CO_2$ and Polyethylene Glycol Systems," J. Lopes et al., *J. Supercritical Fluid*, Vol. 16, pp. 261–267, 2000, as well as fluorinated polyesters FC-430, a registered trademark of 3M Corporation, are soluble in water, xylene, and fluid carbon dioxide.

Accordingly, means are required to stabilize a resist image, particularly an image of high aspect ratio, under conditions that do not distort the image.

SUMMARY OF INVENTION

Means are provided to stabilize a resist image, particularly an image of high aspect ratio, under conditions that do not distort the image. Such means comprise the steps of:

providing a developed resist image;

overcasting said image with a stabilizing layer; and removing said stabilizing layer.

These means provide for the stabilization, against the withdrawal of water, of the image and its protective topcoat layer with liquid or supercritical $CO_2$. Subsequent removal of the $CO_2$ removes the topcoat and dries the resist image without distorting, removing, or collapsing the image.

According to an embodiment of the invention, the resist is cast from and developed in aqueous solutions.

According to an embodiment of the invention, the resist is cast from and developed in organic solutions.

According to an embodiment of the invention, the resist is a negative resist.

According to an embodiment of the invention, the resist is a positive resist.

According to another embodiment of the invention there is provided the substantially non-distorted resist image formed by the inventive process.

According to yet a further embodiment of the invention, there is provided the semiconductor device and other structures fabricated using the resist image of the inventive process.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive

BRIEF DESCRIPTION OF DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

The FIGURE illustrates the steps of the inventive method.

DETAILED DESCRIPTION OF A PREFERRED EMBODIMENT

Reference is made to the figure to illustrate selected embodiments and preferred modes of carrying out the invention. It is to be understood that the invention is not hereby limited to those aspects depicted in the figure. Moreover, a preferred embodiment is described comprising a positive resist, developed in aqueous-based solutions. However, the invention may be embodied as a negative resist and may be embodied as a resist developed in organic-based solutions.

Turning now to the FIGURE, a wafer 10, coated with a layer of photoresist material 12 is shown. A photomask 11 is used to screen an image (arrows) that may be comprised of light of the desired UV frequency or of electrons. The wafer 10 supporting the exposed resist 12 is immersed in an aqueous solution of a tetraalkylammonium hydroxide 13, preferably 0.263 normal tetramethylammonium hydroxide. In the embodiment depicted, the exposed resist material is insoluble in such solutions. The figure indicates that the resist image 12 has a high aspect ratio (height/width). If exposed to high surface tension forces experienced during the drying process, the image may tend to collapse.

While still immersed, the bathing fluid 14 is changed to distilled water to rinse the wafer and then an overcoat 15 is applied. The topcoat can be applied from an aqueous based fluid or a co-solvent mixture as long as the "inert" solvent or topcoat does not distort the resist image by swelling, extraction, or collapsing the image. The stabilizers have to be soluble in the topcoat solvent as well as being able to be removed in liquefied $CO_2$ or supercritical fluid of $CO_2$ and/or inert co-solvents. Polymers or even low molecular film forming substances such as Fluorad (a trademark of 3M) such as FC-430 fluorinated surfactants can be used to overcoat the resist image. The coated resist image is temporarily stabilized prior to removal of the stabilizer by a low surface tension liquid such as $CO_2$. The thickness of the stabilizing coating should be as sufficient as necessary to planarize or partially planarize the resist image sufficiently to prevent image distortion. The minimum thickness of the overcoat is twice the thickness of the resist image. The stabilizing coatings can be cast from aqueous solutions or aqueous mixtures by spin coating or other coating techniques. The stabilizers themselves are mutually soluble in water or liquefied $CO_2$ or other final displacing liquid and are derived from polyethylene oxide, polyethylene oxide dimethylether, and polypropylene oxide, polypropylene oxide dimethylether, perfluoropolyether ammonium carboxylate and copolymers thereof and film forming surfactants as described by O'Neil et al. and Lopes et al. employing the supercritical or liquefied conditions for the $CO_2$ removal of the stabilizers.

Critical point drying from liquid or supercritical $CO_2$ leaves a substantially undistorted resist image 42.

The invention may also be embodied based on organic systems. For example, polymethylmethacrylate-based resists, such as ZEP 7000 (Trademark, Nippon Zeon Corp.) may be used. In such cases the topcoat, such as Fluorad FC-430, is cast from xylene and xylene is dissolved in fluid $CO_2$ to remove the portion of the resist to be stripped prior to critical point drying.

It will, therefore, be appreciated by those skilled in the art having the benefit of this disclosure that this invention is capable of producing a high aspect ratio resist image in a substantially non-distorted state. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense. Moreover, it is intended that the appended claims be construed to include alternative embodiments.

What is claimed is:

1. A method of stabilizing a developed resist image comprising:
    providing a resist image;
    immersing said resist image in a developing fluid;
    maintaining the upper surface of said image in contact with said developing fluid;
    rinsing said resist image with a rinse fluid while maintaining said upper surface in contact with said rinse fluid;
    overcasting said image with a stabilizing film while said resist image remains immersed in said rinse fluid;
    displacing said rinse fluid in contact with said overcast image with a low surface tension final displacing fluid, wherein said displacing fluid is a solvent for said film; and
    critical point drying said final displacing fluid thereby removing said film.

2. A method of stabilizing a developed resist image, according to claim 1, wherein providing a developed resist image comprises:
    providing a wafer mounted on a spin coater;
    applying photoresist to said wafer;
    imaging said photoresist forming a resist image;
    developing said resist image.

3. A method of stabilizing a developed resist image, according to claim 2, wherein developing comprises contacting said resist image with aqueous tetraalkylammonium hydroxide.

4. A method of stabilizing a developed resist image, according to claim 2, wherein said rinse fluid comprises distilled water.

5. A method of stabilizing a developed resist image, according to claim 2, wherein said rinse fluid comprises xylene.

6. A method of stabilizing a developed resist image, according to claim 1, wherein overcasting comprises:
    providing film-forming polymers in said rinse fluid;
    spin coating forming said stabilizing film from said polymers; and
    removing said stabilizing film and said rinse fluid using a low surface tension fluid.

7. A method of stabilizing a developed resist image, according to claim 6, wherein the thickness of said stabilizing film is from about 0.1 micron to about 5 microns.

8. A method of stabilizing a developed resist image, according to claim 6, wherein the thickness of said stabilizing film is at least twice the thickness of the resist image.

9. A method of stabilizing a developed resist image, according to claim 6, wherein said film-forming polymers are miscible with both said rinse fluid and with said low surface tension fluid.

10. A method of stabilizing a developed resist image, according to claim 9, wherein said film-forming polymers are derived from polyalkenoxides and copolymers thereof.

11. A method of stabilizing a developed resist image, according to claim 6, wherein said polymers comprise fluoroaliphatic polyether surfactants.

12. A method of stabilizing a developed resist image, according to claim 6, wherein said low surface tension fluid comprises $CO_2$.

13. A method of stabilizing a developed resist image, according to claim 12, wherein said $CO_2$ is supercritical.

14. A method of stabilizing a developed resist image, according to claim 12, wherein said $CO_2$ is liquid.

15. A method of stabilizing a developed resist image, according to claim 6, wherein said low surface tension fluid comprises $CO_2$ and a about 5% (by volume) of a cosolvent wherein said cosolvent is miscible in fluid $CO_2$.

16. A method of stabilizing a developed resist image, according to claim 15, wherein said cosolvent is chosen from the group consisting of methanol, ethanol, isopropanol, and xylene.

* * * * *